(12) United States Patent
Miwa

(10) Patent No.: US 7,422,937 B2
(45) Date of Patent: *Sep. 9, 2008

(54) SEMICONDUCTOR DEVICE AND MANUFACTURING METHOD THEREOF

(75) Inventor: Tadashi Miwa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/763,764

(22) Filed: Jun. 15, 2007

(65) Prior Publication Data

US 2007/0238290 A1    Oct. 11, 2007

Related U.S. Application Data

(62) Division of application No. 10/983,618, filed on Nov. 9, 2004, now Pat. No. 7,241,651, which is a division of application No. 10/633,230, filed on Aug. 4, 2003, now Pat. No. 6,979,860.

(30) Foreign Application Priority Data

May 30, 2003   (JP)   ............................. 2003-154247

(51) Int. Cl.
*H01L 21/337* (2006.01)

(52) U.S. Cl. ...................... 438/195; 438/196; 438/275; 257/E21.611

(58) Field of Classification Search ................. 438/195, 438/196, 275, 279; 257/E21.611
See application file for complete search history.

(56) References Cited

U.S. PATENT DOCUMENTS

| 7,241,651 B2 * | 7/2007 | Miwa ........................ 438/195 |
| 2006/0081914 A1 | 4/2006 | Miwa |

FOREIGN PATENT DOCUMENTS

| JP | 56-137632 | 10/1981 |
| JP | 11-177070 | 7/1999 |
| JP | 2000-22113 | 1/2000 |
| JP | 2002-176114 | 6/2002 |
| JP | 2003-7870 | 1/2003 |
| JP | 2003-51557 | 2/2003 |
| KR | 10-0190021 | 1/1999 |

* cited by examiner

*Primary Examiner*—Phat X Cao
(74) *Attorney, Agent, or Firm*—Oblon, Spivak, McClelland, Maier & Neustadt, P.C.

(57) ABSTRACT

A semiconductor device manufacturing method including forming at least a first conductive film and a first insulting film above a semiconductor substrate, forming a plurality of first resist patterns above the first insulating film periodically at first intervals, patterning at least the first insulating film by use of the first resist patterns to form a plurality of mask patterns, each of the mask patterns including the first insulating film, selectively forming a second resist pattern in a space between the mask patterns in such a manner that the second resist pattern is formed in the space corresponding to a region where a second wiring structure wider than the first wiring structure is to be formed, and patterning the first conductive film by use of the second resist pattern and the mask patterns.

3 Claims, 8 Drawing Sheets

SEMICONDUCTOR DEVICE AND MANUFACTURING METHOD THEREOF

CROSS-REFERENCE TO RELATED APPLICATIONS

This application is a division of and claims priority to U.S. applicacation Ser. No. 10/983,618 filed on Nov. 9, 2004 U.S. Pat. No. 7,241,651, which is a divisional of Ser. No. 10/633,230, U.S. Pat. No. 6,979,850, issued Dec. 27, 2005, and further claims priority under 35 USC §119 from the prior Japanese Patent Application No. 2003-154247, filed May 30, 2003, the entire contents of which are incorporated herein by reference.

BACKGROUND OF THE INVENTION

1. Field of the Invention

This invention relates to a semiconductor device and a manufacturing method thereof, and more particularly to a semiconductor device with an improved wiring layer structure, such as a nonvolatile semiconductor memory device, and a manufacturing method thereof.

2. Description of the Related Art

A NAND nonvolatile semiconductor memory device has select gates (SO) for connecting a memory cell unit composed of a plurality of memory cells connected in series to bit lines or source lines. The control gate of each memory cell is connected to a word line (WL) Each select gate is connected to a select gate line. Like a memory cell, a select gate has a tunnel oxide film, a floating gate polysilicon (FG Poly) film, an ONO film where a silicon oxide film, a silicon nitride film and a silicon oxide film are stacked one on top of another, a control gate polysilicon (CG Poly) film, a tungsten silicide (WSi) film, and a silicon nitride (SiN) film. After the formation of these films in sequence, the resist is patterned by a lithographic process. With the patterned resist as a mask, the SiN film, WSi film, CG Poly film, ONO film, and FG Poly film are processed by dry etching, thereby forming the word lines and select gate lines.

Two of the select gates are arranged for the 16 or 32 word lines constituting a memory cell unit. To improve the cut-off characteristic of the select gate, the widths of the select gate and select gate line in the direction of channel length are set greater than the width of the word line. For this reason, in the lithographic process of forming the select gate lines and word lines, the word lines adjacent to the select gate lines are influenced more by a complex optical proximity effect than those in the regions where the word lines are arranged at regular intervals.

Moreover, when there is a contact for, for example, a bit line between select gate lines, a space is formed between the select gate lines. This makes an optical proximity effect on the word lines more complex. In forming a mask used to expose a resist on which such a complex optical proximity effect is exerted, the dimensions of a wire adjacent to a thick wire are controlled by making an optical proximity effect correction (OPC) in the mask. The OPC is carried out by simulation. Since OPC simulation models are currently under development, a sufficient accuracy cannot be obtained. As a result, the margin for the focal depth decreases and therefore the resist grows so thin that it can collapse. Therefore, it has been difficult to maintain the accuracy of the dimensions of a word line adjacent to a thick select gate line.

As an example of suppressing the optical proximity effect, the technique for making the width of each select word line equal to the width of each word line and providing two select gates on either side of one memory cell unit, a total of four select gates, and select lines has been developed (Jpn. Pat. Appln. KOKAI Publication No. 2003-51557).

In the example, an optical proximity effect taking place between a word line and a select gate line adjacent to the word line in a nonvolatile semi-conductor memory device has been explained. In semiconductor devices, wires of different widths are often formed next to one another. For this reason, the configuration disclosed in reference may not be used, depending on the circuit configuration or wiring configuration. Therefore, even when wires of different widths are formed next to one another, a semiconductor device capable of improving the accuracy of the dimensions of each wire and a method of fabricating the semiconductor device have been desired.

BRIEF SUMMARY OF THE INVENTION

According to an aspect of the present invention, there is provided a semiconductor device comprising: a plurality of first wiring structures of a first width which are arranged periodically at first intervals; a second wiring structure which is formed next to one of the first wiring structures and the lower part of which has a second width substantially equal to the sum of n times the first width of the first wiring structure (n is a positive integer equal to two or more) and (n−1) times the first interval.

According to another aspect of the present invention, there is provided a semiconductor device manufacturing method comprising: forming at least a first insulating film, a first conductive film, and a second insulating film above a semiconductor substrate sequentially; forming a plurality of first resist patterns above the second insulating film periodically at first intervals, each of the first resist patterns having a first width corresponding to the width of a first wiring structure; patterning at least the second insulating film by use of the first resist patterns to form a plurality of mask patterns, each of the mask patterns including the second insulating film; selectively forming a second resist pattern in a space between the mask patterns in such a manner that the second resist pattern is formed in the space corresponding to a region where a second wiring structure wider than the first wiring structure is to be formed; and patterning the first conductive film by use of the second resist pattern and the mask patterns.

According to still another aspect of the present invention, there is provided a semiconductor device manufacturing method comprising: forming at least a first insulating film, a first conductive film, and a second insulating film above a semiconductor substrate sequentially; forming a first resist with a plurality of first patterns and a second pattern above the second insulating film, the first patterns being formed in a first region above the second insulating film and having almost the same width and interval as those of a plurality of first wiring structures and the second pattern being formed in a second region adjacent to the first region above the second insulating film and having a width substantially equal to the sum of n times the width of a second wiring structure (n is a positive integer equal to two or more) and (n−1) times the interval of the second wiring structures; patterning the second insulating film and the first conductive film by use of the first resist to form the first wiring structures; forming a second resist above the second insulating film in such a manner that the second resist is formed in a region excluding the space between the second wiring structures in the second region; and patterning the second insulating film and the first conductive film by use of the second resist to form the second wiring structures.

According to still another aspect of the present invention, there is provided a semiconductor device manufacturing method comprising: forming at least a first insulating film, a first conductive film, and a second insulating film above a semiconductor substrate sequentially; selectively forming a third insulating film whose etching rate is lower than that of the second insulating film in a position corresponding to the region where a second wiring structure wider than a first wiring structure is to be formed; forming a resist with a plurality of patterns above the second insulating film in the region where the first wiring structures are to be formed, each of the patterns having almost the same width and interval as those of the first wiring structures; and patterning the second insulating film and the first conductive film by use of the resist and the third insulating film to form the first and second wiring structures.

DETAILED DESCRIPTION OF THE INVENTION

Hereinafter, referring to the accompanying drawings, embodiments of the present invention will be explained.

First Embodiment

FIGS. 1 to 5, which show a first embodiment of the present invention, are sectional views of a NAND nonvolatile semiconductor memory device taken in the direction perpendicular to the word line, that is, in the direction of channel length of the memory cell and select gate.

Figure 1:
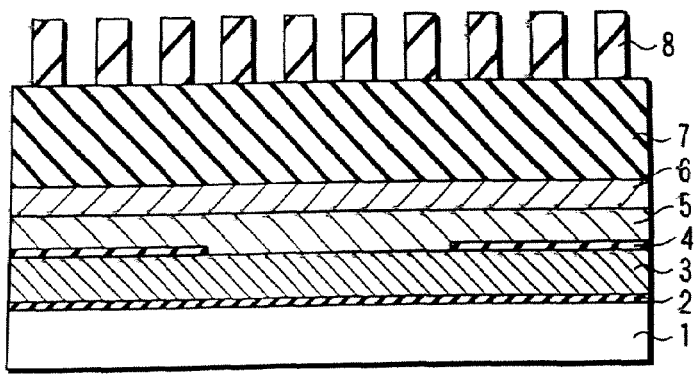
FIG. 1 is a sectional view of a resist formed on an SiN film to explain a manufacturing step according to a first embodiment of the present invention.

As shown in FIG. 1, a tunnel oxide film 2, a floating polysilicon (FG Poly) film 3, and an ONO film 4 are formed on a silicon substrate in that order. In the ONO film 4, a region in which select gate lines are to be formed, or a region corresponding to two adjacent select gate lines and a space between the select gate lines, are removed. The polysilicon film 3 is patterned in the direction perpendicular to the sheet of FIG. 1, thereby forming a pattern (not shown) with a specific width and a space. An element isolating region (not shown) is formed in a self-aligning manner in the space of the pattern of the adjacent polysilicon films 3. Then, on the ONO film 4 and polysilicon film 3, a control gate polysilicon (CG Poly) film 5, a WSi film 6, and an SiN film 7 are formed in that order.

Thereafter, a resist pattern with a specific width and a space is selectively formed on the SiN film 7. The pattern of the resist 8 thus formed has a width corresponding to that of a word line and a space between word lines. With the resist 8 as a mask, the SiN film 7 and WSi film 6 are etched by, for example, dry etching. Then, the resist is removed.

Figure 2:
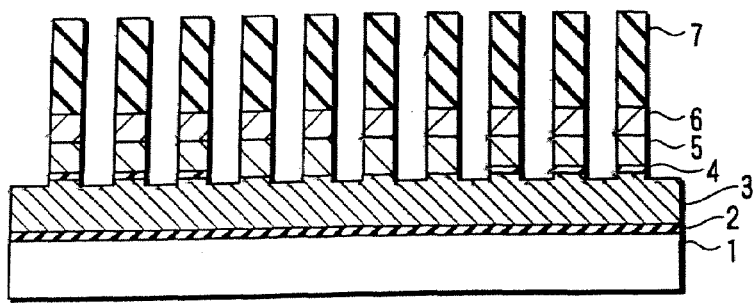
FIG. 2 is a sectional view of a state where etching is effected down to the ONO film, showing a manufacturing step following that of FIG. 1.

Thereafter, as shown in FIG. 2, with the SiN film 7 and WSi film 6 as a mask, the polysilicon film 5 and ONO film 4 are etched by, for example, dry etching. In this way, a periodic mask pattern including the SiN film 7 is formed.

Figure 3:
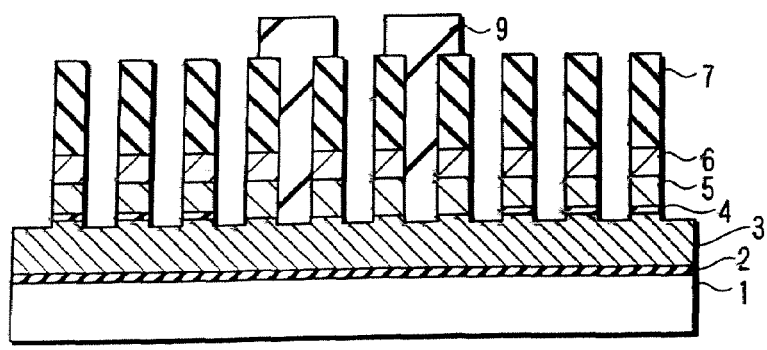
FIG. 3 is a sectional view of a state where a resist is formed in regions where select gate lines are to be formed, showing a manufacturing step following that of FIG. 2.

Then, as shown in FIG. 3, a resist 9 is formed so as to correspond to a region where select gate lines are to be formed. In a NAND nonvolatile semiconductor memory device applied to the first embodiment, memory cell units are arranged on both sides of the contact of, for example, a bit line. These memory cell units are connected via select gates to the contacts of the bit lines in a one-to-one correspondence. For this reason, the select gates of two memory cell units are arranged next to each other. Thus, the resist 9 is formed so as to correspond to a region where two select gates facing each other with a contact between them are to be formed. In this state, with the resist 9 and SiN film 7 to ONO film 4 as a mask, the floating gate polysilicon film 3 is etched by, for example, dry etching. Thereafter, the resist 9 is removed.

Figure 4:
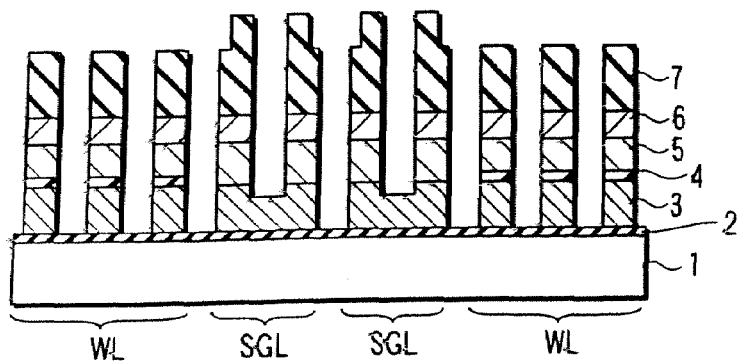
FIG. 4 is a sectional view of a state where select gate lines and word lines are formed, showing a manufacturing step following that of FIG. 3.

In this way, as shown in FIG. 4, word lines WL and select gate lines SGL are formed. A select gate line SGL has two convex parts with the same width as that of the word line in its upper limit and one concave part formed between these convex parts. The width of the concave part is the same as that of the space between word lines. The lower part of the select gate line SGL has a width equivalent to two word lines plus one space. Therefore, the select gate line SGL has a width almost three times the width of the word line WL. In the example, the select gate line SGL adjacent to the contact of a bit line is so formed that it has a width about three times the width of the word line WL. The same holds true for the select gate lines on the source line side.

Figure 5:
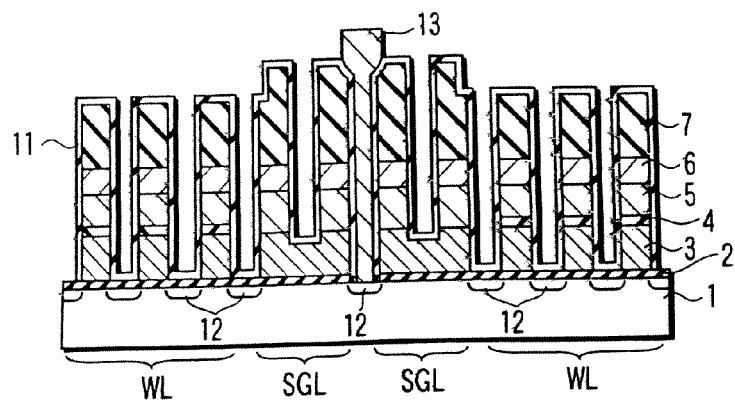
FIG. 5 is a sectional view of a state where a bit line contact is formed, showing a manufacturing step following that of FIG. 4.

Thereafter, as shown in FIG. 5, by known manufacturing processes, an insulating film 11, a diffused layer 12 serving as source and drain regions, a contact 13 for a bit line 13, and others are formed, thereby forming a NAND nonvolatile semiconductor memory device. The contact 13 is made of, for example, tungsten (W). Between the contact 13 and the substrate 1, for example, titanium (Ti) and titanium nitride (TiN) (not shown) are formed.

In the etching process of FIG. 2, etching is effected almost down to the ONO film 4. The present invention is not limited to this. For instance, etching may be effected down to the control gate polysilicon film 5, to the WSi film 6, or to the SiN film 7.

In the first embodiment, the width of the upper part of the select gate line SGL and the space are set equal to those of the word line. This prevents the periodicity of the pattern in the region where word lines are to be formed from collapsing in the region where select gate lines are to be formed in the lithographic processes. Thus, in the region where these wires are formed, since an optical proximity effect is periodic, a margin for the focal depth in the lithography can be improved. This is helpful in miniaturizing the width of each wire and the space between wires in a periodic pattern.

Moreover, the width of the select gate line SGL is made greater than that of the word line WL. For this reason, even when the elements are miniaturized, the cut-off characteristic of the select gate can be improved.

Figure 6:
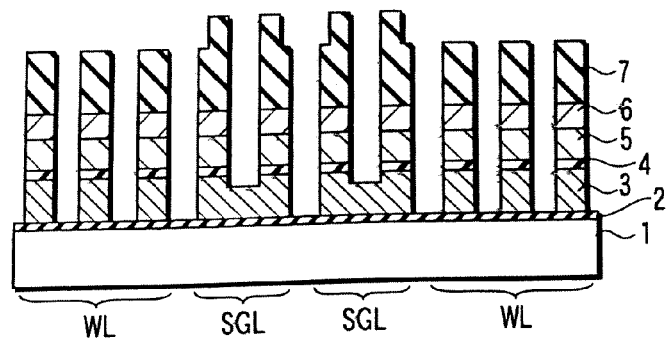
FIG. 6 is a sectional view of a modification of the first embodiment.

FIG. 6 shows a modification of the first embodiment. In the first embodiment, the polysilicon film 3 for the select gate lines SGL shown in FIG. 5 is patterned in such a manner that it corresponds to the individual memory cells arranged in the direction perpendicular to the sheet of the figure. Thus, it is necessary to form a contact on the polysilicon film 5 of the select gate line SGL formed continuously in the direction perpendicular to the sheet and supply a potential from the polysilicon film 5 to the polysilicon film 3, thereby operating the select gate of the selected memory cell unit. For this reason, the ONO film 4 corresponding to the select gate lines SGL is removed. However, when the polysilicon film 3 of the select gate lines SGL is formed continuously in the direction perpendicular to the sheet, the ONO film 4 may be formed in the part corresponding to the select gate line SGL as shown in FIG. 6. The reason for this is that forming a contact to the polysilicon film 3 at any part of the select gate line SGL enables the select gate of the selected memory cell unit to operate. Alternatively, the ONO film may be removed in from any part of the polysilicon film 3 and the polysilicon film 5 may be connected to the polysilicon film 3. In FIG. 6, the ONO film 4 has an opening whose width is almost the same as that of the space between word lines. The presence or absence of the opening depends on the etching condition for the WSi layer 6 and polysilicon film 5 and therefore is arbitrary.

Furthermore, when the polysilicon film 3 for the select gate lines SGL is patterned so as to correspond to the individual memory cells arranged in the direction perpendicular to the sheet, the ONO film 4 may be formed in the parts corresponding to the select gate lines SGL as shown in FIG. 6. In this case, an opening may be made in the ONO film 4 of each select gate line SGL as shown in FIG. 6. Through this opening, the polysilicon film 5 may be connected to the polysilicon film 3.

Second Embodiment

FIGS. 7 to 12 show a second embodiment of the present invention. In the second embodiment, the same parts as those in the first embodiment are indicated by the same reference numerals.

While in the first embodiment of FIG. 3, the resist 9 covering the regions acting as select gate lines has been formed, the second embodiment is such that an insulating film whose etching rate is lower than that of the SiN film, such as alumina ($Al_2O_3$), is formed beforehand in the regions serving as select gate lines and, with the insulating film as a mask, the select gate lines are formed.

Figure 7:
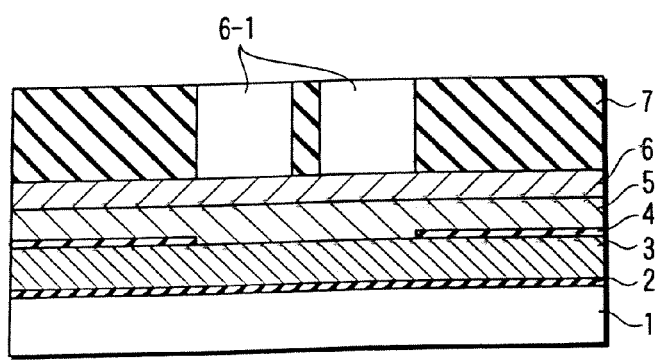
FIG. 7 is a sectional view of an SiN film in which openings are made, which helps explain a manufacturing step according to a second embodiment of the present invention.

Specifically, as shown in FIG. 7, on a silicon substrate 1, a tunnel oxide film 2, a floating gate polysilicon film 3, an ONO film 4, a control gate polysilicon film 5, a WSi film 6, and SiN film 7 are formed in that order as in the first embodiment. Thereafter, openings 6-1 are made in the SiN film 7 so as to correspond to the regions serving as select gate lines.

Figure 8:
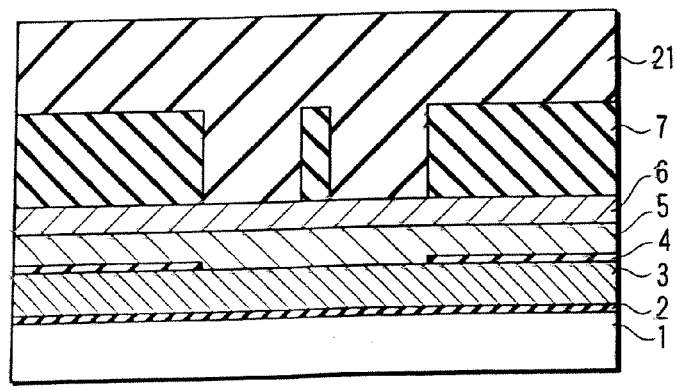
FIG. 8 is a sectional view of a state where an insulating film is formed all over the substrate, showing a manufacturing step following that of FIG. 7.

Then, as shown in FIG. 8, an insulating film 21 made of, for example, alumina ($Al_2O_3$) is formed all over the surface, with the result that the openings 6-1 are filled with the insulating film 21.

Figure 9:
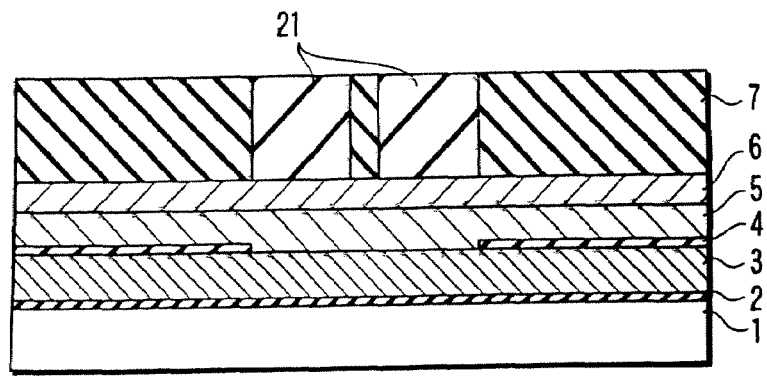
FIG. 9 is a sectional view of a state where the openings are filled with the insulating film, showing a manufacturing step following that of FIG. 8.

Thereafter, as shown in FIG. 9, with the SiN film 7 as a stopper, the insulating film 21 is polished flat by chemical mechanical polishing (CMP). In this way, the insulating film 21 is formed in the regions where select gate lines are to be formed.

Figure 10:
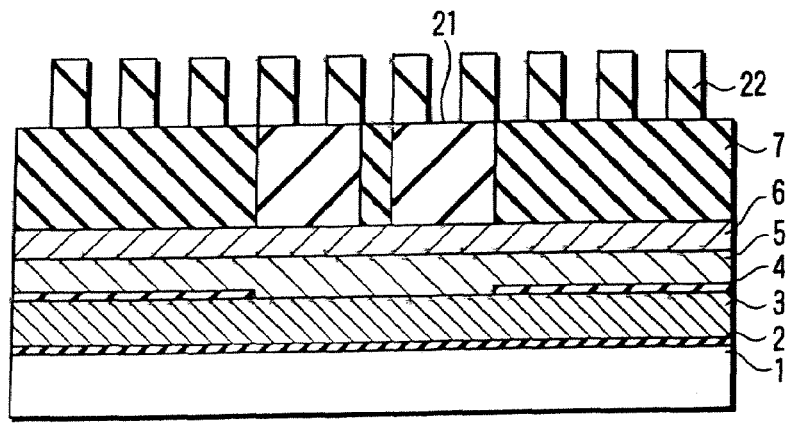
FIG. 10 is a sectional view of a state where a resist is formed on the SiN film and insulating film, showing a manufacturing step following that of FIG. 9.

Next, as shown in FIG. 10, a pattern of the resist 22 is formed on the SiN film 7 and insulating film 21. The width of the resist 22 and the space between resists 22 are made almost equal to the width of the word line and the space between word lines.

Figure 11:
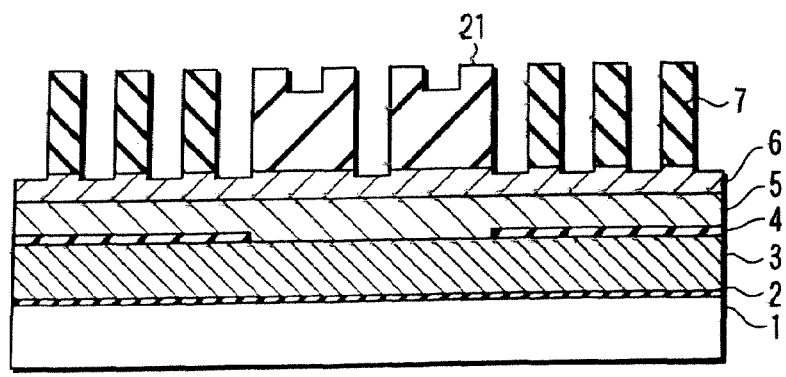
FIG. 11 is a sectional view of a state where the SiN film is etched, showing a manufacturing step following that of FIG. 10.

Then, as shown in FIG. 11, with the resist 22 as a mask, the SiN film 7 is etched. Although the etching rate of the insulating film 21 is a little lower than that of the SiN film 7, it is etched slightly. As a result, at the top of the insulating film 21 not covered with the resist 22, a concave part is formed. Thereafter, the resist 22 is removed.

Figure 12A:
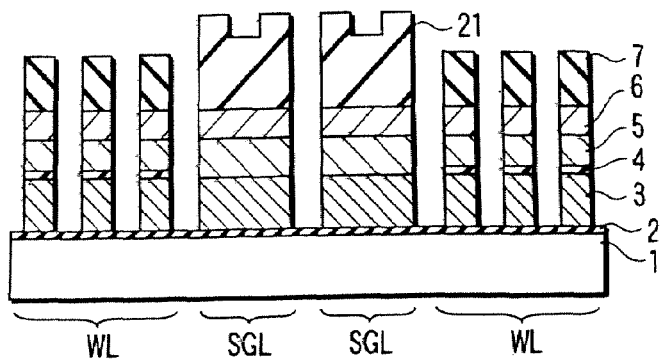
FIGS. 12A and 12B are a sectional view of a state where select gate lines and word lines are formed, showing a manufacturing step following that of FIG. 11.

Then, as shown in FIG. 12A, with the SiN film 7 and insulating film 21 as a mask, the WSi film 6, control gate polysilicon film 5, ONO film 4, floating gate polysilicon film 3 are etched. In this way, the select gate lines having the insulating film 21 at the top layer and the word lines WL having the SiN film 7 at the top layer are formed. At this time, since the etching rate of the insulating film 21 is lower than that of the SiN film 7, the film thickness of the entire stacked layer in the select gate line region is greater than the film thickness of the entire stacked layer in the word line region.

In each of the select gate lines SGL formed as described above, the insulating films 21 has two convex parts with the same width as that of the word line. The space between the convex parts is made equal to the space between word lines. On the other hand, the lower part of each of the select gate lines SGL has a width virtually equivalent to two word lines and one space. Therefore, the select gate line SGL is almost three times as wide as the word line WL. In such a select gate line SGL, the width of one of the two convex parts at the top and the width of its lower part may be a width to which an error in aligning the resist 22 with the insulating film 21 in the formation of the resist 22 is added.

Thereafter, by known manufacturing processes, the source and drain regions, bit lines, and others are formed, which completes a NAND nonvolatile semiconductor memory device.

Figure 12B:
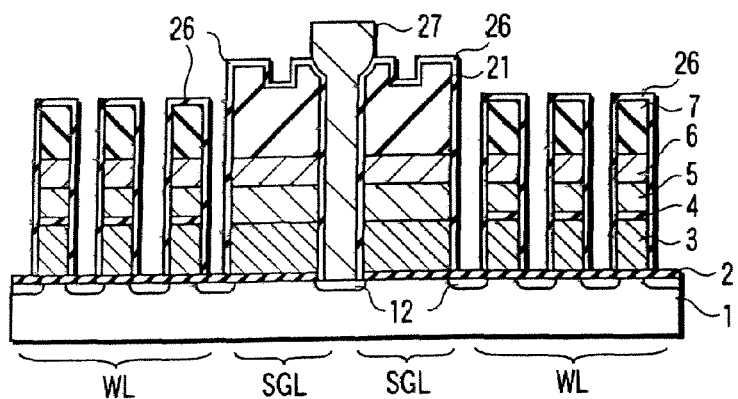

FIG. 12B shows a state where a contact 27 is formed between adjacent select gate lines SGL. The sidewalls of the word lines WL and select gate lines SGL are covered with, for example, a silicon oxide film 26. A contact 27 is formed between adjacent select gate lines SGL. The contact 27 is made of, for example, tungsten (W). Between the contact 27 and the substrate 1, for example, titanium (Ti) and titanium nitride (TiN) (not shown) are formed. The configuration of the contact may be applied to each of the embodiments explained below.

In the process of FIG. 10, all of the SiN is removed in the regions corresponding to the select gate lines, leaving only the insulating film 21. However, only part of the top layers of the regions corresponding to the select gate lines are made up of the insulating film 21, with the SiN film 7 left under the insulating film 21.

The second embodiment produces the same effect as the first embodiment. In addition, with the second embodiment, the material (e.g., alumina) whose etching rate is lower is used as a filler material (e.g., tungsten) between select gate lines SGL. This makes it possible to use the insulating film 21 made of alumina as a mask material superior to the SiN film 7 in forming a contact between select gate lines in a self-aligning manner.

Third Embodiment

FIGS. 13 to 16 show a third embodiment of the present invention. In the second embodiment, the insulating film 21 has been formed inside the SiN film 7. In contrast, in the third embodiment, the insulating film 21 is formed on the SiN film 7 in such a manner that the film 21 corresponds to the regions where select gate lines are to be formed.

Figure 13:
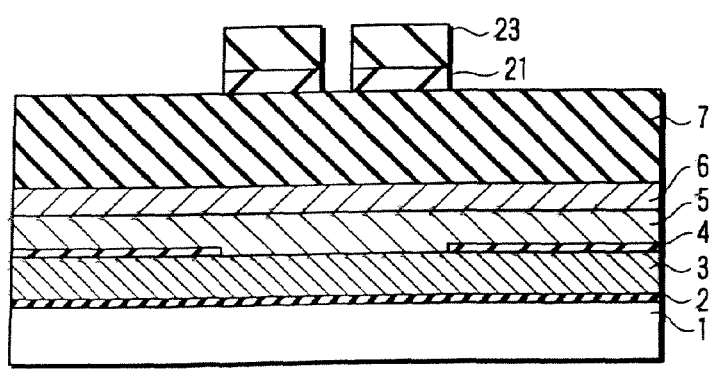
FIG. 13 is a sectional view of a state where an insulating film is formed on the SiN film, which helps explain a manufacturing step according to a third embodiment of the present invention.

Specifically, as shown in FIG. 13, a tunnel oxide film 2, a floating gate polysilicon film 3, an ONO film 4, a control gate polysilicon film 5, a WSi film 6, and SiN film 7 are formed on a silicon substrate 1 in that order. Thereafter, on the SiN film 7, a film whose etching rate is lower than that of the SiN film 7, such as an insulating film 21 made of $Al_2O_3$, is formed. On the insulating film 21, a resist 23 is formed so as to correspond to the regions where select gate lines are to be formed. With the resist 23 as a mask, the insulating film 21 is etched, with the result that the insulating film 21 is left only in the regions where select gate lines are to be formed. Thereafter, the resist 23 is removed.

Figure 14:
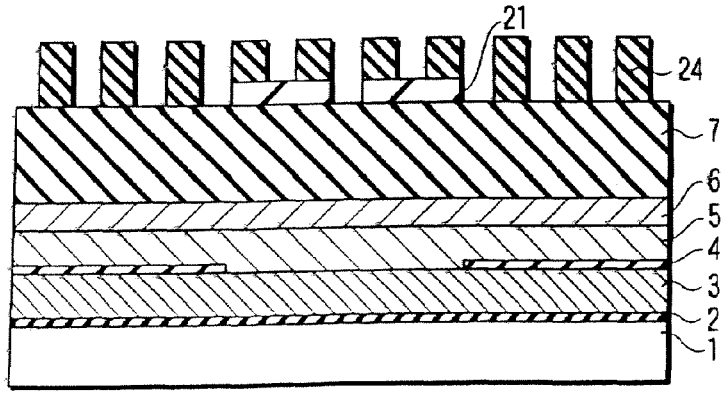
FIG. 14 is a sectional view of a state where a resist is formed on the SiN film and insulating film, showing a manufacturing step following that of FIG. 13.

Next, as shown in FIG. 14, a patterned resist 24 is formed on the SiN film 7 and the insulating film 21. The width of a resist 24 and the space between resists 24 are made almost equal to the width of the word line and the space between word lines.

Figure 15:
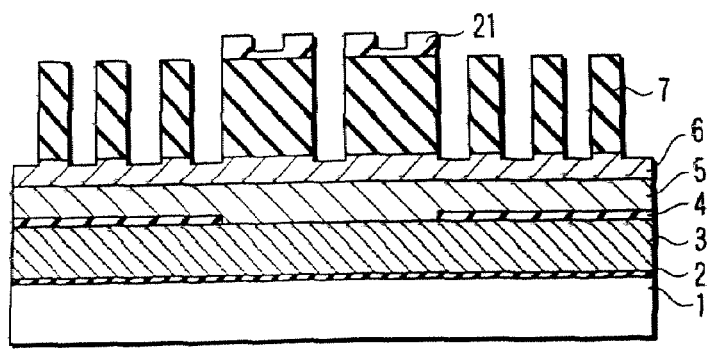
FIG. 15 is a sectional view of a state where the SiN film is etched, showing a manufacturing step following that of FIG. 14.

Then, as shown in FIG. 15, with the resist 24 and insulating film 21 as a mask, the SiN film 7 is etched. Although the etching rate of the insulating film 21 is a little lower than that of the SiN film 7, the insulating film 21 is etched slightly. As a result, at the top of the insulating film 21 not covered with the resist 24, a concave part is formed. Thereafter, the resist 24 is removed.

Figure 16:
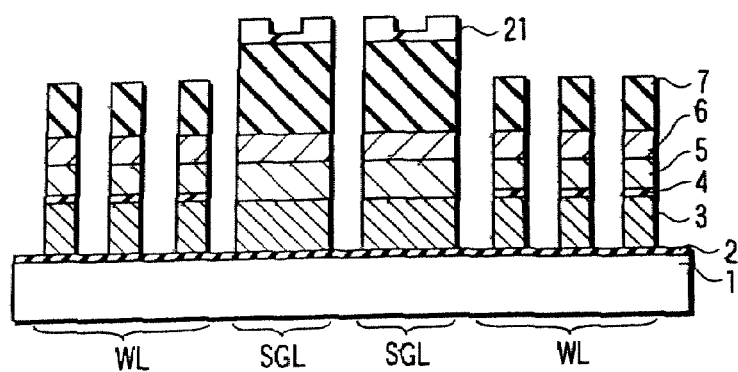
FIG. 16 is a sectional view of a state where select gate lines and word lines are formed, showing a manufacturing step following that of FIG. 15.

Thereafter, as shown in FIG. 16, with the insulating film 21 and the SiN film 7 as a mask, the WSi film 6, control gate polysilicon film 5, ONO film 4, floating gate polysilicon film 3 are etched, thereby forming select gates SGL and word lines WL. At this time, since the etching rate of the insulating film 21 is lower than that of the SiN film 7, the insulating film 21 is left. Even if all of the insulating film 21 is removed, the SiN film 7 left on the top of the select gate line SGL is thicker than the SiN film 7 left on the top of the word line WL. For this reason, when a contact is formed between select gate lines SGL adjacent to each other in a subsequent step, the SiN film 7 can be used as a mask, which makes it unnecessary to form an additional mask film.

The third embodiment produces the same effects as the first and second embodiments.

In the first to third embodiments, the present invention has been applied to the memory cell array in a NAND nonvolatile semiconductor memory device. The invention is not limited to the memory cell array. For instance, the invention may be applied to the formation of a pattern for the peripheral circuit of a nonvolatile semiconductor memory device, provided that the circuit pattern has wires of different widths formed next to one another.

Figure 17:
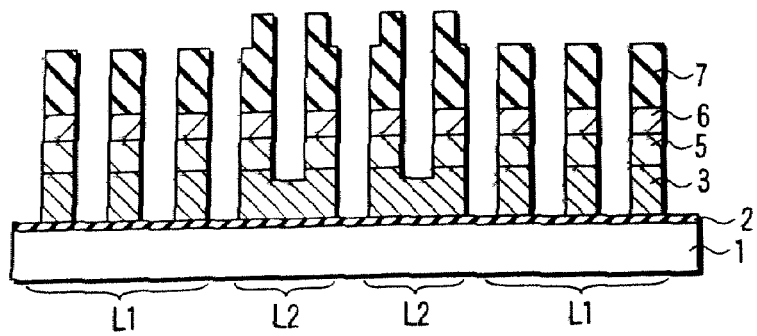
FIG. 17 is a sectional view of an example where the first embodiment is applied to the peripheral circuit of a semiconductor device, showing a modification of the first embodiment.
Figure 18:
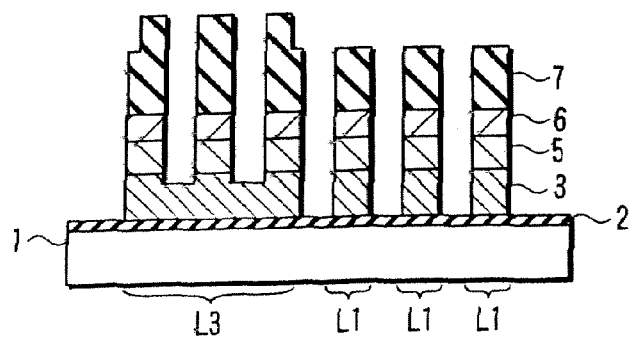
FIG. 18 is a sectional view of a modification of wires of different widths in the first embodiment.

FIGS. 17 and 18 show modifications of the first embodiment. The concepts shown in FIGS. 17 and 18 may be applied to the second and third embodiments.

FIG. 17 is a case where the first embodiment is applied to the peripheral circuit of, for example, a nonvolatile semiconductor memory device. In the figure, a circuit pattern with first wires L1 and second wires L2 is shown. These first and second wires L1, L2 have the same configuration as that of the first embodiment except that none of them have the ONO film 4.

The peripheral circuit with such a configuration can be formed by the same manufacturing method as in the first embodiment. Specifically, a resist pattern having almost the same width as that of the first wire L1 and the space between first wires L1 is formed. Then, etching is effected down to any position below the SiN film 7. Then, after a resist is formed in a region where second wires L2 are to be formed, the remaining parts of the WSi film 6 and polysilicon films 5, 3 are etched. This configuration produces the same effect as the first embodiment.

In the first to third embodiments, the width of the select gate line SGL is almost three times that of the word line WL. The relationship in width between adjacent wires is not limited to this.

In FIG. 18, the width of the third wire L3 is set to about five times the width of the first wire L1. The width of the third wire L3 is generally set to the sum of n times the width of the first wire L1 and (n−1) times the width of the space between first wires L1. When the first wire L1 and the third wire L3 meet such a relationship, the first and third wires can be formed in the same manners as in the first to third embodiments, which produces the same effects as the first to third embodiments.

Furthermore, the first to third embodiments are not limited to a nonvolatile semiconductor memory device and may be applied to the formation of the circuit pattern of another semiconductor device. In this case, the stacked structure of the tunnel oxide film 2, floating gate polysilicon film 3, ONO film 4, control gate polysilicon film 5, and WSi film 6 is not restricted to what has been explained above and may take any other configuration.

Fourth Embodiment

Figure 19A:
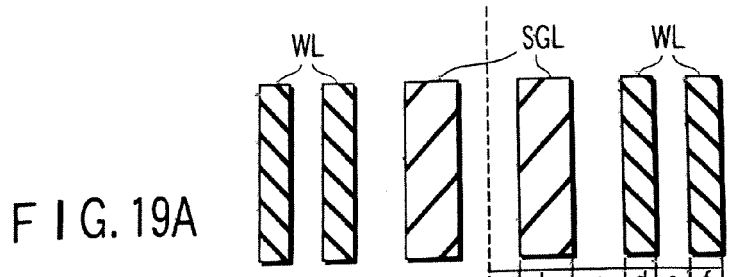
FIG. 19A is a plan view of an example of the arrangement of select gate lines SGL and word lines WL.

FIG. 19A shows an example of the arrangement of select gate lines SGL and word lines WL. In the arrangement, there is a space between select gate lines SGL. As a result, when an attempt is made to form a resist in such a manner that the resist corresponds to the select gate lines SGL and word lines WL, the optical proximity effect becomes complicated, making it difficult to form the resist with a high dimensional precision.

To overcome this problem, the first to third embodiments cause the width of a resist pattern formed in the region where select gate lines are to be formed and the space between resist patterns to coincide with the width of a word line and the space between word lines. In contrast, the fourth embodiment causes a resist pattern formed in the region where select gate lines are to be formed to differ from the pattern of word lines or select gate lines.

Figure 19B:
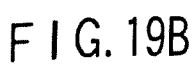
FIG. 19B is a plan view of the shape of a resist according to a fourth embodiment of the present invention.

Specifically, as shown in FIG. 19B, in the fourth embodiment, resist patterns 31-1 corresponding to word lines and a resist pattern 31-2 corresponding to a region equivalent to the sum of two select gate lines SGL and the space between these select gate lines SGL are formed. Then, the region where the word lines to be formed is processed. Thereafter, the resist pattern 31-2 is removed. Then, a resist having an opening corresponding to the space between two select gate lines SGL is formed. Using this resist, the select gate lines are formed.

FIGS. 20 to 23 show the fourth embodiment.

Figure 20:
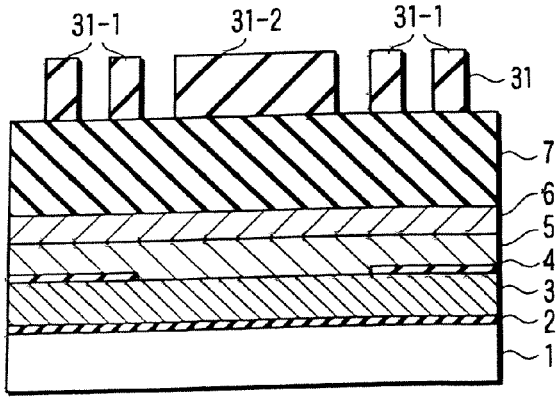
FIG. 20 is a sectional view of a state where a resist is formed on the SiN film, which helps explain a manufacturing step according to the fourth embodiment.

As shown in FIG. 20, a tunnel oxide film 2, a floating polysilicon film 3, an ONO film 4, a control gate polysilicon film 5, a WSi film 6, and an SiN film 7 are formed on a silicon substrate 1 in that order. Thereafter, a resist 31 is selectively formed in such a manner that the resist corresponds to the region where each word line is to be formed and the region where two select gate lines and a space between select gate lines are provided. That is, the resist 31-1 formed in the region corresponding to a word line is made equal to the width of the word line and the space between word lines. The resist 31-2 formed between resists 31-1 arranged periodically as described above has a width virtually equivalent to two select gate lines SGL and a space between these select gate lines SGL.

Figure 21:
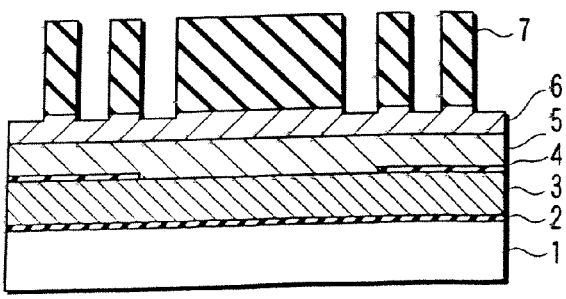
FIG. 21 is a sectional view of a state where the SiN film is etched, showing a manufacturing step following that of FIG. 20.

Next, as shown in FIG. 21, with the resists 31-1, 31-2 as a mask, the SiN film 7 is etched by, for example, dry etching. Then, the resist is removed.

Figure 22:
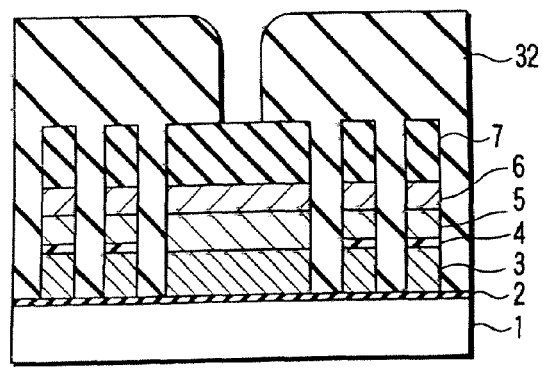
FIG. 22 is a sectional view of a state where a resist is formed to form a space between select gate lines, showing a manufacturing step following that of FIG. 21.

Thereafter, as shown in FIG. 22, with the SiN film 7 as a mask, the WSi film 6, control gate polysilicon film 5, ONO film 4, and floating gate polysilicon film 3 are etched by, for example, dry etching. In this way, a word line group having a periodic wire width and space is formed in the region where word lines constituting a memory cell unit are to be formed. Then, a resist 32 is formed on a region excluding a portion between two adjacent select gate lines which are to be formed.

Thereafter, with the resist 32 as a mask, the SiN film 7, WSi film 6, control gate polysilicon film 5, ONO film 4, and floating gate polysilicon film 3 between regions where two select gate lines are to be formed between word line groups are etched by, for example, dry etching.

Figure 23:
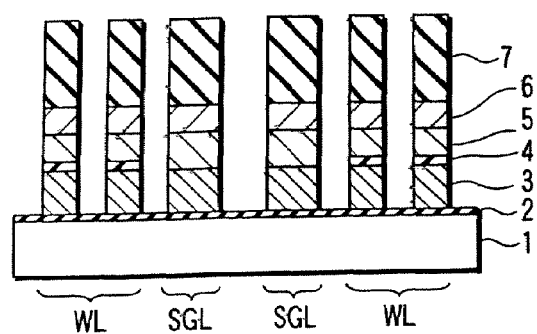
FIG. 23 is a sectional view of a state where select gate lines and word lines are formed, showing a manufacturing step following that of FIG. 22.

In this way, as shown in FIG. 23, two select gate lines SGL adjacent to each other are formed. The width of the select gate line SGL can be changed by the space used in forming the resist 32.

In the fourth embodiment, a wider resist 31-2 (shown in FIG. 19B) corresponding to two select gate lines SGL and the space between these select gate lines SGL are formed next to the resist 31-1 corresponding to a word line. When the resist 31-2 is formed into a thick wire, the optical proximity effect of the resist 31-1 adjacent to the resist 31-2 becomes simple. This makes it easy to make a mask correction by OPC. Therefore, the accuracy of the mask and the dimensional precision of the resist can be improved and word lines with a desired width can be formed.

Fifth Embodiment

Figure 24:
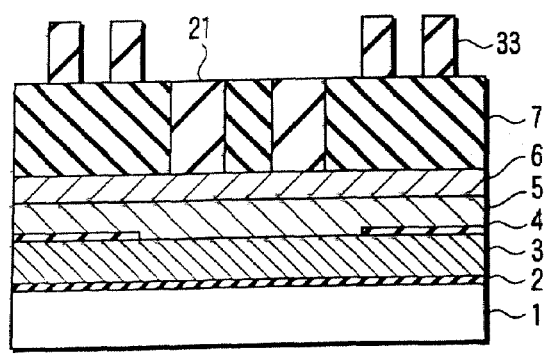
FIG. 24 is a sectional view of a state where a resist is formed on the SiN film filled with an insulating film, which helps explain a manufacturing process according to the fifth embodiment.
Figure 25:
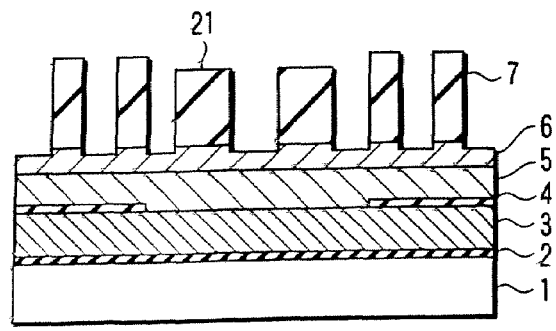
FIG. 25 is a sectional view of a state where the SiN film is etched, showing a manufacturing step following that of FIG. 24.
Figure 26:
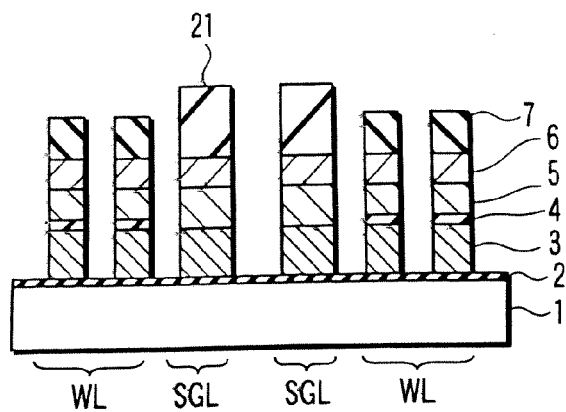
FIG. 26 is a sectional view of a state where select gate lines and word lines are formed, showing a manufacturing step following that of FIG. 25.

FIGS. 24 to 26 show a fifth embodiment of the present invention. In FIG. 24, an insulating film 21 in the SiN film 7 is formed so as to correspond to the regions where select gate lines are to be formed. In the fifth embodiment, the steps up to the formation of the insulating film 21 in the SiN film 7 are the same as those in FIGS. 7 to 9 in the second embodiment, so explanation of them will be omitted.

Figure 19C:
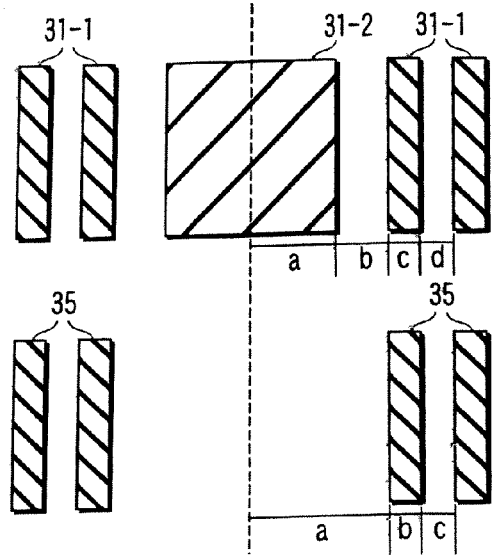
FIG. 19C is a plan view of the shape of a resist according to a fifth and a sixth embodiment of the present invention.

In FIG. 24, on the SiN film 7, a resist 33 is formed so as to correspond to the regions where word lines are to be formed. The width of the resist 33 and the space between resists 33 are made almost equal to the width of the word line and the space between word lines. In places corresponding to the regions where select gate lines are to be formed, the resist 33 is not formed. That is, as shown in FIG. 19C, a space is formed between regions where word lines WL constituting adjacent memory cells are to be formed.

Thereafter, as shown in FIG. 25, with the resist 33 as a mask, the SiN film 7 is etched by, for example, dry etching. Although the etching rate of the insulating film 21 is lower than that of the SiN film 7, the insulating film 21 is etched slightly because it is not masked. Then, the resist 33 is removed.

Thereafter, as shown in FIG. 26, with the SiN film 7 and insulating film 21 as a mask, the WSi film 6, control gate polysilicon film 5, ONO film 4, and floating gate polysilicon film 3 are etched by, for example, dry etching, which forms the select gate lines SGL and word lines WL.

The insulating film 21 functions as a mask material for etching to form the select gate lines. The word lines WL are formed using the SiN film 7 as a mask. Thus, the height of the select gate line SGL and that of the word line WL differ, depending on the difference in etching rate between the SiN film and the insulating film 21.

In FIG. 24, the regions where the select gate lines to be formed are only in the insulating film 21, because the SiN film 7 is not left. However, the SiN film 7 may be left under the insulating film 21.

Unlike the fourth embodiment, the fifth embodiment is such that the resist is not formed so as to correspond to the regions where the select gate lines are to be formed. With such a configuration, the optical proximity effect of the resist corresponding to the word lines is simple. Thus, it is possible to correct the mask easily by OPC and form the resist and word lines with high dimensional precision.

As in the second embodiment, when a material whose etching rate is lower than that of the filler material between select gate lines is used, the material can be used as a mask material superior to the SiN film 7 in forming a contact between select gate lines in a self-aligning manner. For instance, when alumina ($Al_2O_3$) is used as the insulating film 21 and tungsten is used as the filler material, the etching rate of alumina is lower than that of tungsten or the SiN film. Thus, it is possible to avoid the overetching of the contact and prevent the electrical short of the contacts and the select gate lines reliably.

Sixth Embodiment

Figure 27:
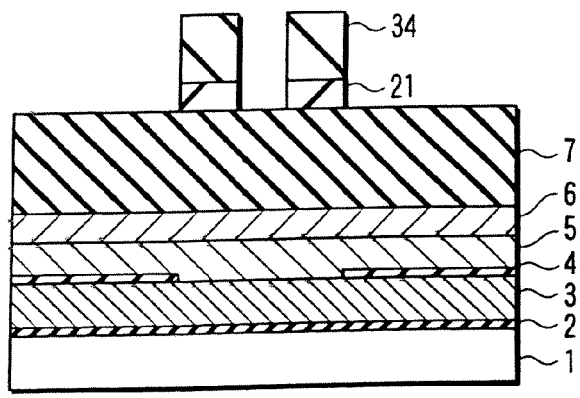
FIG. 27 is a sectional view of a state where an insulating film is formed on the SiN film, which shows a manufacturing step according to the sixth embodiment.
Figure 28:
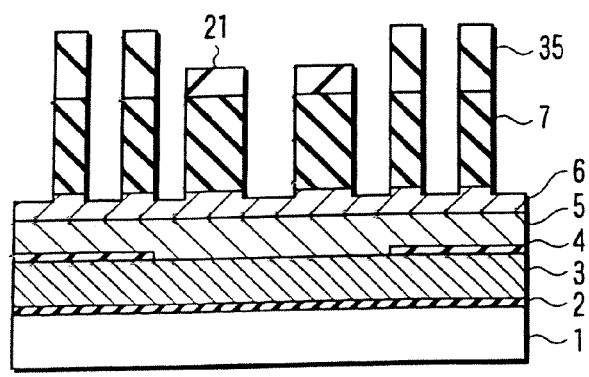
FIG. 28 is a sectional view of a state where the SiN film is etched, showing a manufacturing step following that of FIG. 27.
Figure 29:
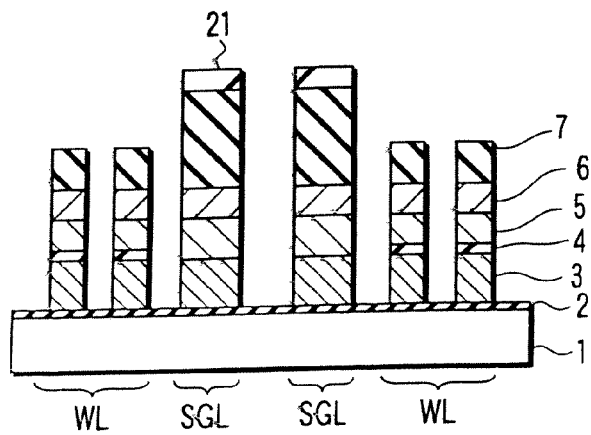
FIG. 29 is a sectional view of a state where select gate lines and word lines are formed, showing a manufacturing step following that of FIG. 28.

FIGS. 27 to 29 show a sixth embodiment of the present invention. The sixth embodiment, which is a modification of the third and fifth embodiments, is such that an insulating film 21 is formed on the SiN film 7 so as to correspond to the regions where select gate lines are to be formed.

In FIG. 27, the step of forming a resist 34 on the insulating film 21 so as to correspond to the regions where select gate lines to be formed to the step of etching the insulating film 21 with the resist 34 as a mask are the same as those in the third embodiment. Thus, explanation of these steps will be omitted. Following these steps, the resist 34 is removed.

Thereafter, as shown in FIG. 28, a resist 35 is formed on the SiN film 7 so as to correspond to the regions where word lines are to be formed. The width of the resist 35 and the space between resists 35 are made almost equal to the width of the word line and the space between word lines. The resist 35 is not formed in the places on the SiN film 7 and insulating film 21 corresponding to the regions where select gate lines are to be formed. Specifically, as shown in FIG. 19C, a space is formed between regions where word lines WL constituting adjacent memory cell units are to be formed. Then, with the resist 35 and insulating film 21 as a mask, the SiN film 7 is etched by, for example, dry etching. Thereafter, the resist 35 is removed.

Next, as shown in FIG. 29, with the insulating film 21 and SiN film 7 as a mask, the WSi film 6, control gate polysilicon film 5, ONO film 4, and floating gate polysilicon film 3 are etched by, for example, dry etching. As a result, the select gate lines SGL and word lines WL are formed. At this time, since the etching rate of the insulating film 21 is lower than that of the SiN film 7, the insulating film 21 is left even after slight etching. Alternatively, even if the insulating film 21 is removed during the processing, the height of the wires in the select gate line regions is greater than that of the wires in the word line regions.

Therefore, the sixth embodiment produces the same effect as the fifth embodiment.

In the fourth to sixth embodiments, the circuit pattern of the memory cell array in a nonvolatile semiconductor memory device has been formed. The present invention is not limited to this. For instance, the invention may be applied to the formation of the pattern of the peripheral circuit of a nonvolatile semiconductor memory device or the circuit pattern of another semiconductor device as in the first to third embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
    forming at least a first conductive film and a first insulating film above a semiconductor substrate;
    forming a plurality of first resist patterns above the first insulating film periodically at first intervals, the first resist patterns corresponding to a first wiring structure;
    patterning at least the first insulating film by use of the first resist patterns to form a plurality of mask patterns, each of the mask patterns including the first insulating film;
    selectively forming a second resist pattern in a space between the mask patterns in such a manner that the second resist pattern is formed in the space corresponding to a region where a second wiring structure wider than the first wiring structure is to be formed; and
    patterning the first conductive film by use of the second resist pattern and the mask patterns.

2. The device according to claim 1, wherein the first conductive film is configured by a polysilicon film.

3. The device according to claim 1, wherein the first insulating film is configured by a silicon nitride film.

* * * * *